(12) United States Patent
Reinke et al.

(10) Patent No.: US 6,532,715 B2
(45) Date of Patent: Mar. 18, 2003

(54) SEMICONDUCTOR SUBSTRATE PROCESSING TOOL AND FABRICATIONS FACILITIES INTEGRATION PLATE

(75) Inventors: Lance Reinke, Pleasanton, CA (US); Glenn Lattig, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 13 days.

(21) Appl. No.: 09/797,074

(22) Filed: Feb. 28, 2001

(65) Prior Publication Data

US 2002/0116882 A1 Aug. 29, 2002

Related U.S. Application Data

(60) Provisional application No. 60/217,248, filed on Jul. 10, 2000.

(51) Int. Cl.$^7$ .................................. E04B 1/00
(52) U.S. Cl. .................. 52/745.21; 52/745.05
(58) Field of Search ................ 52/270.5, 741.1, 52/220.1, 220.8, 745.05, 263; 137/884; 257/618

(56) References Cited

U.S. PATENT DOCUMENTS

| | | | |
|---|---|---|---|
| 4,852,516 A | 8/1989 | Rubin et al. | 118/715 |
| 5,048,195 A | 9/1991 | Leonov | 33/645 |
| 5,053,637 A | 10/1991 | Dillard | 307/147 |
| 5,960,638 A | 10/1999 | McCabe et al. | 62/90 |

FOREIGN PATENT DOCUMENTS

| | | | |
|---|---|---|---|
| DE | 3524076 A1 | 11/1986 | H02G/1/08 |
| WO | WO 99/46803 | 9/1999 | H01L/21/00 |

OTHER PUBLICATIONS

Pub. No.: US 2002/0052157 A1.*
Pub. No.: US 2001/0001215 A1.*
Pub. No.: US 2001/0013371 A1.*

* cited by examiner

*Primary Examiner*—Carl D. Friedman
*Assistant Examiner*—Nahid Amiri
(74) *Attorney, Agent, or Firm*—Moser Patterson & Sheridan

(57) ABSTRACT

An apparatus and method for installing a plurality of facilities conduits in a wafer fabrication facility for subsequent coupling to a wafer-processing tool. The apparatus comprises a facilities integration plate and a gauge fixture removably inserted within the facilities integration plate. The method comprises the steps of determining a location where the wafer-processing tool is positioned in the wafer fabrication facility, forming a cutout in a floor of the fabrication facility, and providing the plurality of facilities conduits through the cutout in the floor. The facilities integration plate is mounted within the cutout in the floor, and the gauge fixture is disposed within the facilities integration plate. The facilities conduits are sized to a length defined by the gauge fixture and the wafer-processing tool is coupled to the plurality of facilities conduits.

15 Claims, 6 Drawing Sheets

SEMICONDUCTOR SUBSTRATE PROCESSING TOOL AND FABRICATIONS FACILITIES INTEGRATION PLATE

CROSS REFERENCE

This application claims benefit of U.S. Provisional Application No. 60/217,248, filed Jul. 10, 2000, which is hereby incorporated by reference in its entirety.

BACKGROUND OF THE DISCLOSURE

1. Field of Invention

The present invention relates generally to a method and apparatus for installing a semiconductor substrate processing tool at a semiconductor substrate fabrication facility. More specifically, the invention relates to a semiconductor substrate processing tool adapter.

2. Description of the Background Art

Integrated circuits have evolved into complex devices that include millions of transistors, capacitors and resistors on a single chip. The evolution of chip designs continually requires faster circuitry and greater circuit density. As the demand for integrated circuits continue to rise, chip manufactures have demanded semiconductor process tooling having increased wafer throughput and greater product yield. To meet this increase in throughput, tooling is being developed to process wider diameter wafers, for example, wafers having diameters of 300 millimeters (mm).

The chip manufactures order semiconductor wafer-processing tools from semiconductor processing tool manufacturers, such as Applied Materials, Inc., of Santa Clara, Calif. Prior to delivery of the semiconductor wafer processing tool, the chip manufacturer prepares the facility to receive and install the tool. Preparations include establishing placement of where the tool is to be located in a room, and providing the necessary facilities conduits ("rough plumbing") to carry electricity, process and exhaust gases, and fluids between the facilities and the processing tool. A footprint of the tool is provided to the chip manufacturer for laying out the facilities conduits. Once the rough plumbing of the facilities conduits have been installed, they extend through the floor for subsequent connection to the processing tool.

However, it has been observed that upon delivery of the processing tool to the chip manufacturer's facility, the facilities conduits often obstruct the final positioning of the processing tool. As such, positioning the processing tool is cumbersome and the facilities conduits are subject to being damaged. Furthermore, additional time is required to complete the facilities conduits connections to the wafer-processing tool once the wafer-processing tool is positioned. This is particularly evident for coupling gas lines, which are hard line facilities conduits that do not flex.

Therefore, there is a need in the art for a method and apparatus that allows a chip manufacturer to run the necessary facilities conduits to the wafer-processing tool without interfering with positioning and installing the processing tool. Moreover, it would be desirable for such an apparatus to minimize the installation time to couple the facilities conduits to the processing tool. Furthermore, it would be desirable to allow access to provide ease of installation and serviceability.

SUMMARY OF INVENTION

The disadvantages associated with the prior art are overcome by the present invention of an apparatus and method for installing a plurality of facilities conduits in a wafer fabrication facility for subsequent coupling to a wafer-processing tool. The apparatus comprises a facilities integration plate and a gauge fixture removably inserted within the facilities integration plate.

The method comprises the steps of determining a location where the wafer-processing tool is positioned in the wafer fabrication facility, forming a cutout in a floor of the fabrication facility, and providing the plurality of facilities conduits through the cutout in the floor. The facilities integration plate is mounted within the cutout in the floor, and the gauge fixture is disposed within the facilities integration plate. The facilities conduits are sized to a length defined by the gauge fixture and the wafer-processing tool is coupled to the plurality of facilities conduits.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element, which are common to the figures.

DETAIL DESCRIPTION OF INVENTION

The present invention generally provides a method and apparatus for preparing an integrated circuit chip manufacturing facility for subsequent installation of a semiconductor substrate (wafer) processing tool. The invention is illustratively described for use with a chemical vapor deposition system, such as a CENTURA™ metal etch, decoupled plasma source (DPS) platform, manufactured and sold by Applied Materials, Inc. of Santa Clara, Calif. However, it should be understood that the invention may be incorporated into other chamber configurations such as physical vapor deposition chambers, etch chambers, ion implant chambers, and other semiconductor processing chambers.

Figure 1:
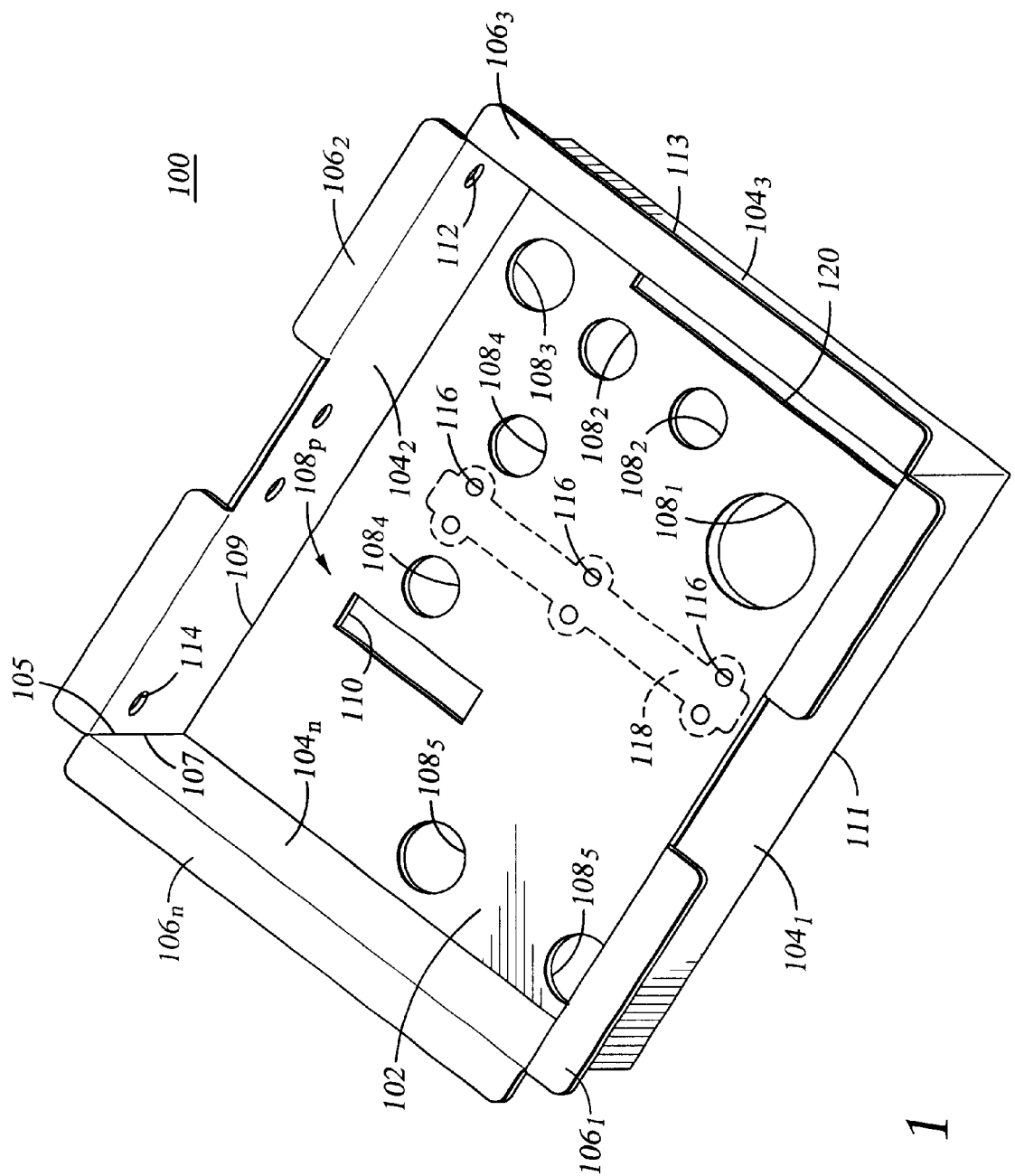
FIG. 1 depicts a perspective view of a facilities integration plate of the present invention.

FIG. 1 depicts a perspective view of a facilities integration plate 100 of the present invention. Specifically, FIG. 1 depicts an illustrative facilities integration plate 100 that generally comprises a bottom plate 102, a plurality of sidewalls $104_1$ to $104_n$ (collectively sides 104), a plurality of flanges or "lips" $106_1$ to $106_n$ (collectively flanges 106) corresponding with each side, and a plurality of apertures $108_1$ to $108_p$, for interfacing between a facilities floor and a wafer-processing tool as described in greater detail below.

The sidewalls 104 have a lower edge 107 (only one shown for sake of clarity in FIG. 1) coupled to the perimeter 109 of the bottom plate 102 and extend upward approximately perpendicular from the bottom plate 102. Furthermore, the flanges 106 are formed at an upper edge 105 of the sidewalls 104 approximately perpendicular to the sidewalls 104. The flanges 106 extend outward from the sidewalls 104 such that the overall dimension of the facilities integration plate 100 is greater around the perimeter 113 of the flanges 106 than the perimeter 109 of the bottom plate 102. A person skilled in the art will understand that the number of sidewalls 104 and flanges 106 correspond with the shape of the bottom plate 102, which is defined by the type of semiconductor processing tool being installed at a wafer fabrication facility. For the CENTURA™ 300 semiconductor wafer-processing tool discussed above, the bottom plate 102 is rectangular, having four sidewalls 104 and four corresponding flanges 106 extending therefrom. The rectangular shape is preferable as opposed to a circular or other shape, because of the ease of cutting and installing such shape into a raised floor of a fabrication facility. However, this does not preclude the shape of the bottom plate 102 from being any other polygonal structure.

The facilities integration plate 100 is fabricated from a non-corrosive material such as aluminum or stainless steel. In the preferred embodiment, the facilities integration plate 100 is fabricated from a ⅛" thickness stainless steel sheet. In one embodiment, the facilities integration plate 100 is formed as one piece. To facilitate such one-piece adapter plate construction, the sheet is cut and pressed to define the tray-like shaped facilities integration plate 100. Specifically, the adjacent sidewalls 104 and flanges 106 are cut and bent such that a lower edge 107 of the sidewalls 104 circumscribe the perimeter of the bottom plate 102, and the flanges 106 extend from an upper edge 105 of the sidewalls 104. Thus, the flanges 106 are approximately parallel to the bottom plate 102. Once formed into the rectangular shape, each adjacent sidewall 104 is sealed together by means known to those skilled in the art, such as, but not limited to, welding, brazing, or using a fastener such as a screw or the like.

The facilities integration plate 100 further comprises a plurality of apertures $108_p$ (where p is an integer greater than or equal to 1 (collectively apertures 108)). The apertures 108 are used to accommodate various sized facilities conduits (not shown in FIG. 1), which pass through the facilities integration plate 100 from the floor of the fabrication facility to the wafer-processing tool. The apertures 108 have a shape that will facilitate the various sized facilities conduits. However, one skilled in the art will recognize that any shape may be utilized, which will align and facilitate the passage of the facilities conduits. In addition, a lip slot 120 is provided through the bottom plate 102 along one of the sidewalls (e.g., sidewall $104_3$). The lip slot 120 serves as an auxiliary pass-through for any additional cabling as required.

Figure 2:
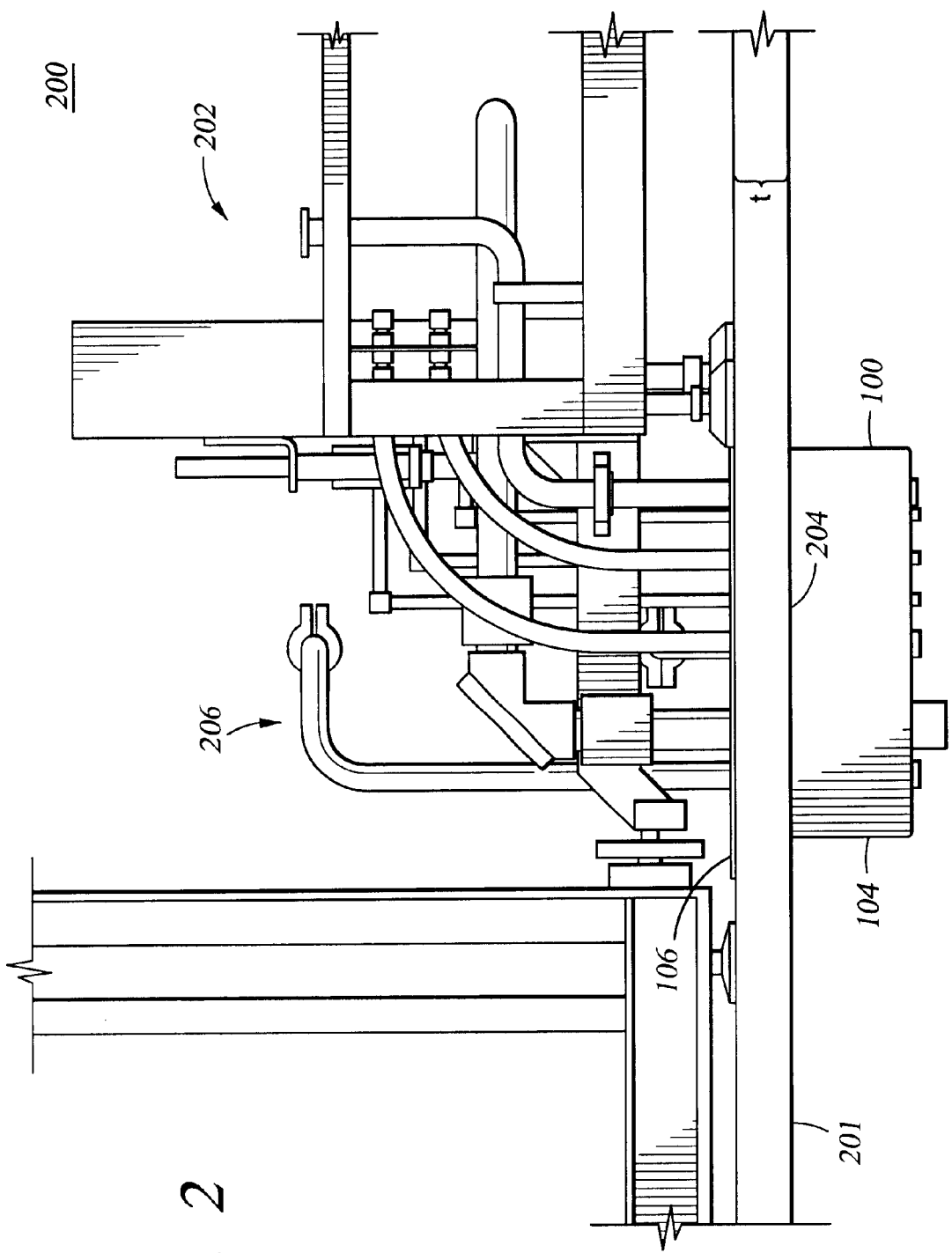
FIG. 2 depicts a side view of a semiconductor wafer-processing tool and the facilities integration plate of FIG. 1.
Figure 3:
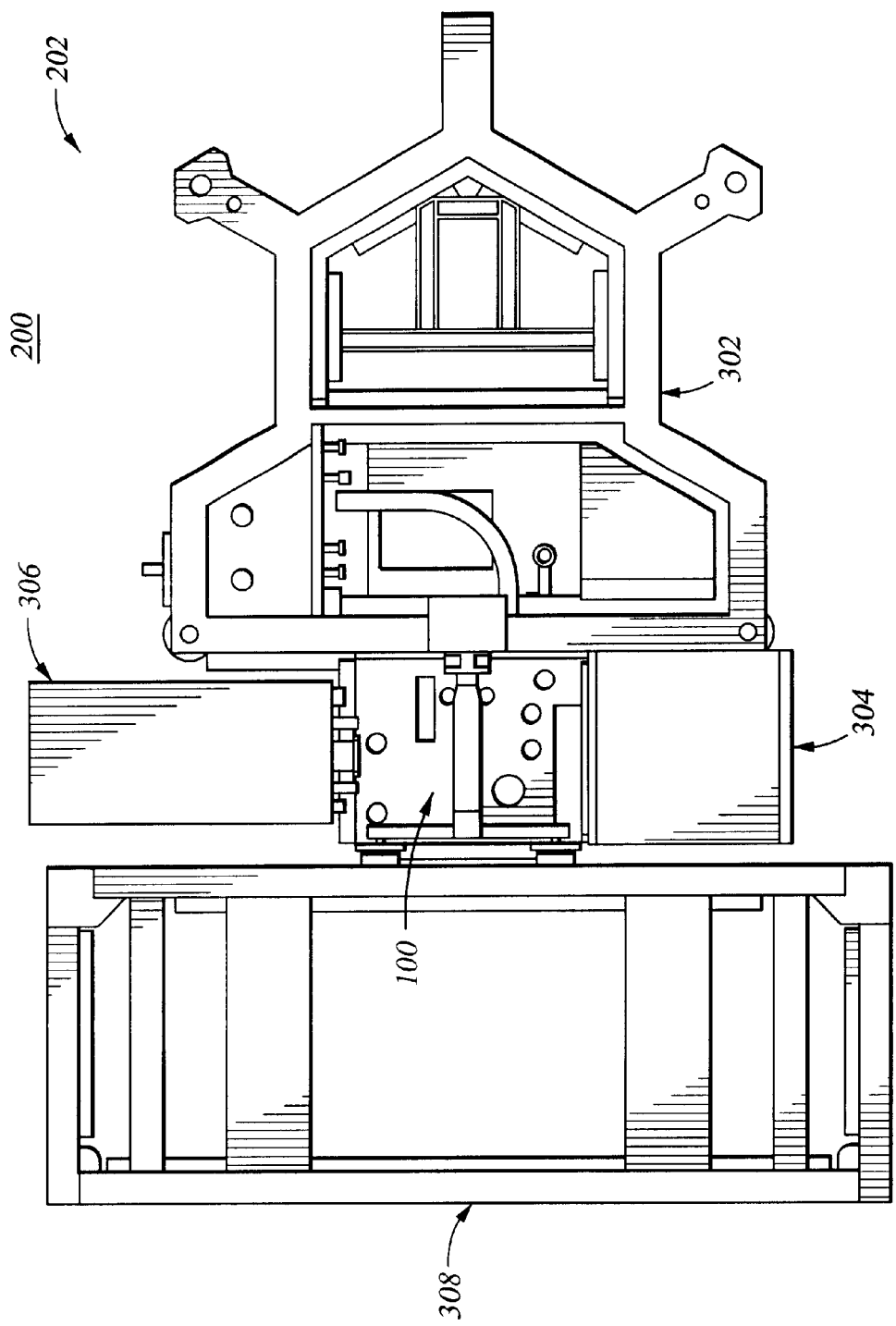
FIG. 3 depicts a top view of the semiconductor wafer-processing tool and the facilities integration plate of FIG. 1.

FIG. 2 depicts a side view of the semiconductor wafer-processing tool 202 and the facilities integration plate 100 of FIG. 1. FIG. 3 depicts a top view of a semiconductor wafer-processing tool 202 and the facilities integration plate 100 of FIG. 1. FIGS. 2 and 3 should be viewed together for a full understanding of the adapter plate's function and positioning relevant to the semiconductor wafer-processing tool 202 in a semiconductor wafer fabrication facility 200.

Referring to FIG. 2, a wafer fabrication facility 200 comprises a floor 201 having the facilities integration plate 100 disposed therein. Specifically, the facilities integration plate 100 is disposed in a cutout 204 in the floor 201. The cutout 204 is positioned in the floor 201 at a predetermined position such that the wafer-processing tool 202 will have ample clearance and accessibility in the fabrication facility 200.

The cutout 204 is sized slightly larger than the perimeter 111 of the sidewalls 104 of the facilities integration plate 100 to allow the sidewalls 104 to pass through the cutout 204 during installation. The flange 106 is seated flush against the floor 201. In one embodiment, the cutout 204 is approximately ¼" greater than the sidewall perimeter 111 of the facilities integration plate 100. In this manner, the flange 106 overlies the cutout 204 and supports the facilities integration plate 100 on the surface of the floor 201.

Referring to FIG. 1, a plurality of bores 112 are positioned through the sidewalls 104 at a distance below the flange 106 and axially aligned with the floor 201. A fastener 114 is disposed through the bores 112 and is received by the floor to accurately position and secure the facilities integration plate 100 in the cutout 204. In one embodiment, a pair of threaded bores 112 are positioned through the sidewalls 104 on opposing sides (e.g., $104_1$ and $104_2$). A fastener 114 such as a set-screw or locking screw (not shown) is threaded into each of the bores 112 and extends to the thickness "t" of the floor. Upon tightening the set-screws, the facilities integration plate 100 is secured in the cutout 204. In one embodiment, the floor 201 is fabricated from metal sheets having a thickness of 1.751" and raised above a sub-floor (not shown). Moreover, the bores 112 are positioned in the sidwalls 104 at a distance, for example, approximately 0.9" from the top of the flange 106, such that the set-screws are axially aligned mid way in the floor thickness. Furthermore, a person skilled in the art will recognize that other fasteners and techniques may be used to secure the facilities integration plate 100 in the cutout 204.

Referring to FIG. 3, an illustrative semiconductor wafer-processing tool 202 is disposed adjacent the facilities integration plate 100. Specifically, the facilities integration plate 100 permits various components of the tool 202, such as a mainframe 302, a controller 304, vacuum pumps 306, a factory interface 308, and the like to be positioned adjacent or proximate to each side 104 of the facilities integration plate 100.

Figure 4:
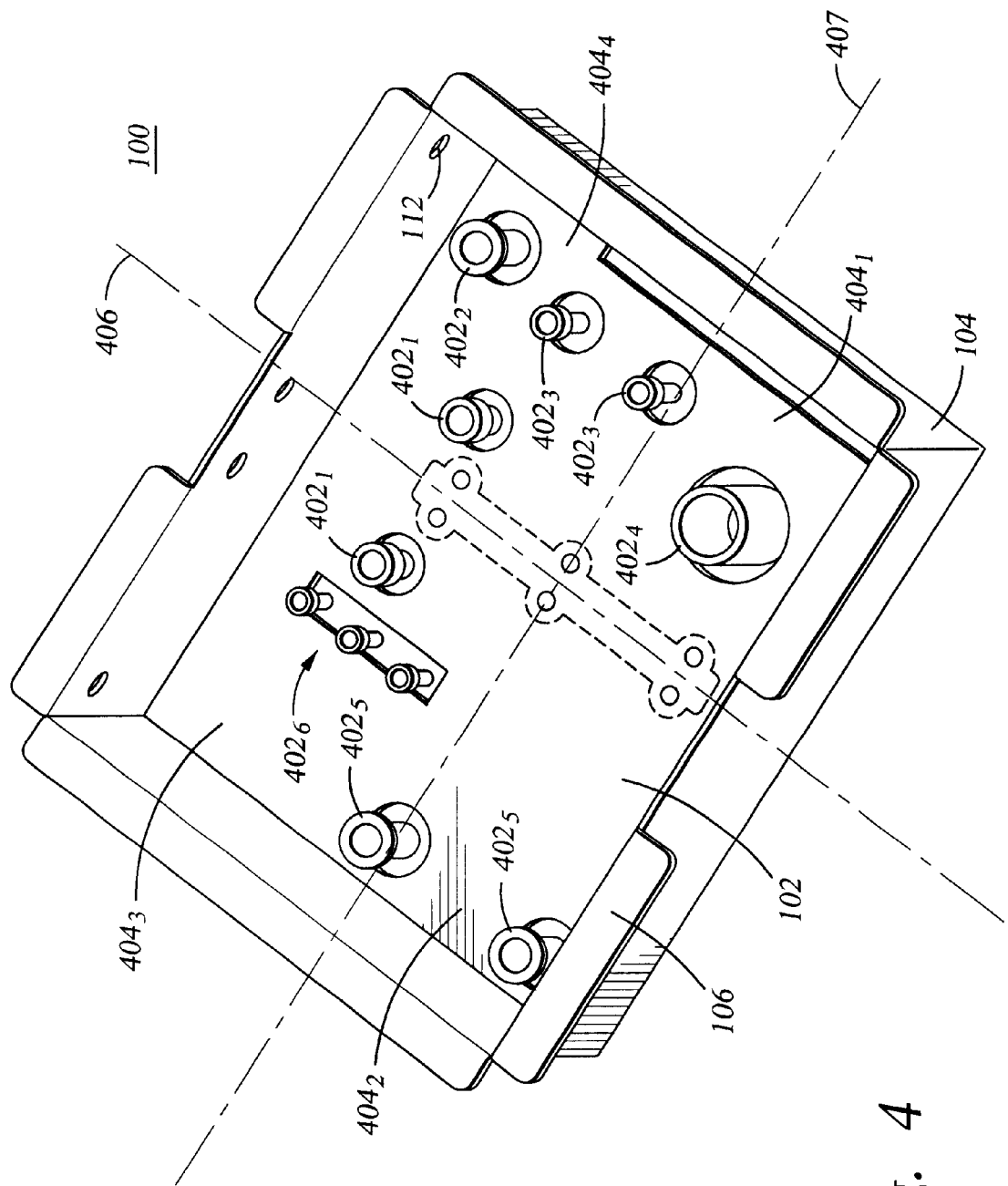
FIG. 4 depicts a perspective view of a facilities integration plate of FIG. 1, and a plurality of facilities conduits extending therethrough.

FIG. 4 depicts a perspective view of a facilities integration plate 100 of FIG. 1, and a plurality of facilities conduits $402_1$ through $402_r$ (collectively facilities conduits 402) extending therethrough. Specifically, the facilities integration plate 100 accommodates passage of the plurality of facilities conduits $402_r$, where r is an integer greater than one, which extend through the plurality of apertures $108_p$ and a slot 110. Generally, the facilities conduits 402 are tubular, and accordingly, in the embodiment of FIG. 1, the apertures 108 have a circular shape of various diameters, which are sized to receive the tubular shaped conduits 402. As such, each facilities conduit 402 passes through a corresponding aperture 108. Where numerous facilities conduits 402 are grouped together, a single slot 110, sized to receive such group of facilities conduits is used, however, three individual apertures positioned proximate each other may also be utilized.

For example, in the preferred embodiment of the facilities integration plate 100 for use with the CENTURA™ 300 wafer-processing tool 202, 6 screw holes 116, 8 circular apertures $108_2$ through $108_6$ having various diameters, and the slot 110 are formed in the bottom plate 102 of the facilities integration plate 100. In particular, the 6 screw holes 116 are utilized to secure a water sensor (not shown) disposed on the bottom plate 102 for detecting fluid leaks. Additionally, a pair of facilities cooling fluid lines (i.e., a supply and return) $402_1$, a facilities transfer chamber over-pressure exhaust conduit $402_2$, a pair of facilities clean dry air lines (i.e., a supply and return) $402_3$, a facilities power conduit $402_4$ for providing AC power, a pair of integrated point of use pump (IPUP) facilities exhaust conduits $402_5$ each pass through the plurality of apertures 108 at various locations on the bottom plate 102. Furthermore, a plurality of facilities inert gas conduits $402_6$ (e.g., 3 inert gas conduits) pass through the slot 112 in the bottom plate 102.

The location of each aperture 108 in the bottom plate 102 corresponds with the functionality and size of a particular conduit 402. A portion of the facilities conduits have supply and return lines, such as the facilities cooling fluid lines and facilities dry air conduits. Typically the supply and return lines are installed as pairs of conduits. As such, the pair of facilities conduits and corresponding apertures 108 in the bottom plate 102 are located proximate each other. Furthermore, the facilities power conduit, which provides power from the facilities to the tool 202, is isolated from the other facilities conduits to prevent undesirable electrical conditions such as arcing, grounding, capacitance, inductance, and the like caused by fluid leaks, undesired contact between facilities conduits, and the like.

In the embodiment depicted by FIG. 4, the facilities integration plate 100 is divided into quadrants along perpendicular axes 406 and 407. As such, the facilities power conduit $402_4$ is located in a first quadrant $404_1$ of the bottom plate 102 by itself. The pair of IPUP facilities exhaust conduits $402_5$ is positioned in a second quadrant $404_2$. The plurality of facilities inert gas conduits $402_6$ are positioned in a third quadrant $404_3$. The facilities transfer chamber overpressure exhaust conduit $402_2$ and the pair of facilities clean dry air lines $402_3$ are positioned in a fourth quadrant $404_4$. A water-sensor 118 (drawn in phantom) is centrally positioned along axis 406, which divides the first and fourth quadrants from the second and third quadrants, and the pair of cooling fluid lines $402_1$ are disposed on either side of water-sensor 118 in the third and fourth quadrants $402_3$ and $402_4$. However, a person skilled in the art will understand that any layout of the apertures 108 in the X-Y plane on the bottom plate 102 may be formed to accommodate the type and number of facilities conduits 402, safety issues, and the like.

Each aperture 108 circumscribes a corresponding facilities conduit and is sized to permit installation of the facilities integration plate 100 over conduit couplers, such as N25 flanges, SWAGELOCK™ fittings, pressure fittings, and the like that are disposed on the ends the facilities conduits 402. In this manner, the facilities conduits for gases, exhaust, power, and cooling fluids are provided from the processing facility 200 beneath the flooring 201, and positioned in a standardized format for a specific processing tool model adjacent to the wafer-processing tool 202 for subsequent connection. In addition, each aperture 108 is identified by textural markings (not shown) defining the type of facilities conduit. The identifying markings are preferably silk screened on the bottom plate 102, however other identifying markings may be utilized such as labels, engraving, and the like.

The facilities conduits 402 are coupled to corresponding conduits in the wafer-processing tool 202. Referring to FIG. 2, a plurality of interface conduits (i.e., interface kit) 206 are utilized to interface between each facilities conduit 402 and each wafer-processing tool conduit. The lengths of each interface conduit is a predetermined size to accommodate the conduit couplers, correct matching of interface to facilities conduits, standardization during manufacturing, accessibility during installation, and the like. As such, the facilities conduits 402 also range in various heights as measured from the surface of the floor 201.

In the embodiment depicted in FIG. 1 for the CENTURA™ 300 platform, the sidewalls 104 of the facilities integration plate 100 illustratively has a length, width, and height of approximately 17.3", 13.61", and 5.8" respectively. A person skilled in the art will understand that the dimensions of the facilities integration plate 100 are dependent on the wafer fabrication facility and the type of semiconductor processing tool being installed and, accordingly, the above illustrative dimensions should not be considered as limiting. The height of the pair of facilities cooling fluid lines $402_1$, the pair of facilities clean dry air lines $402_3$, and the plurality of facilities inert gas conduits $402_6$ are approximately 3" below the top surface of the floor 201. Furthermore, the facilities transfer chamber overpressure exhaust conduit $402_2$, the facilities power conduit $402_4$, and the pair of facilities pump exhausts $402_5$ are approximately 4" below the top surface of the floor 201. Thus, the facilities conduits 402 extending from the fabrication facility 200 are positioned below the floor 201, and within the confines of the facilities integration plate 100 at various heights below the floor 201.

Figure 5:
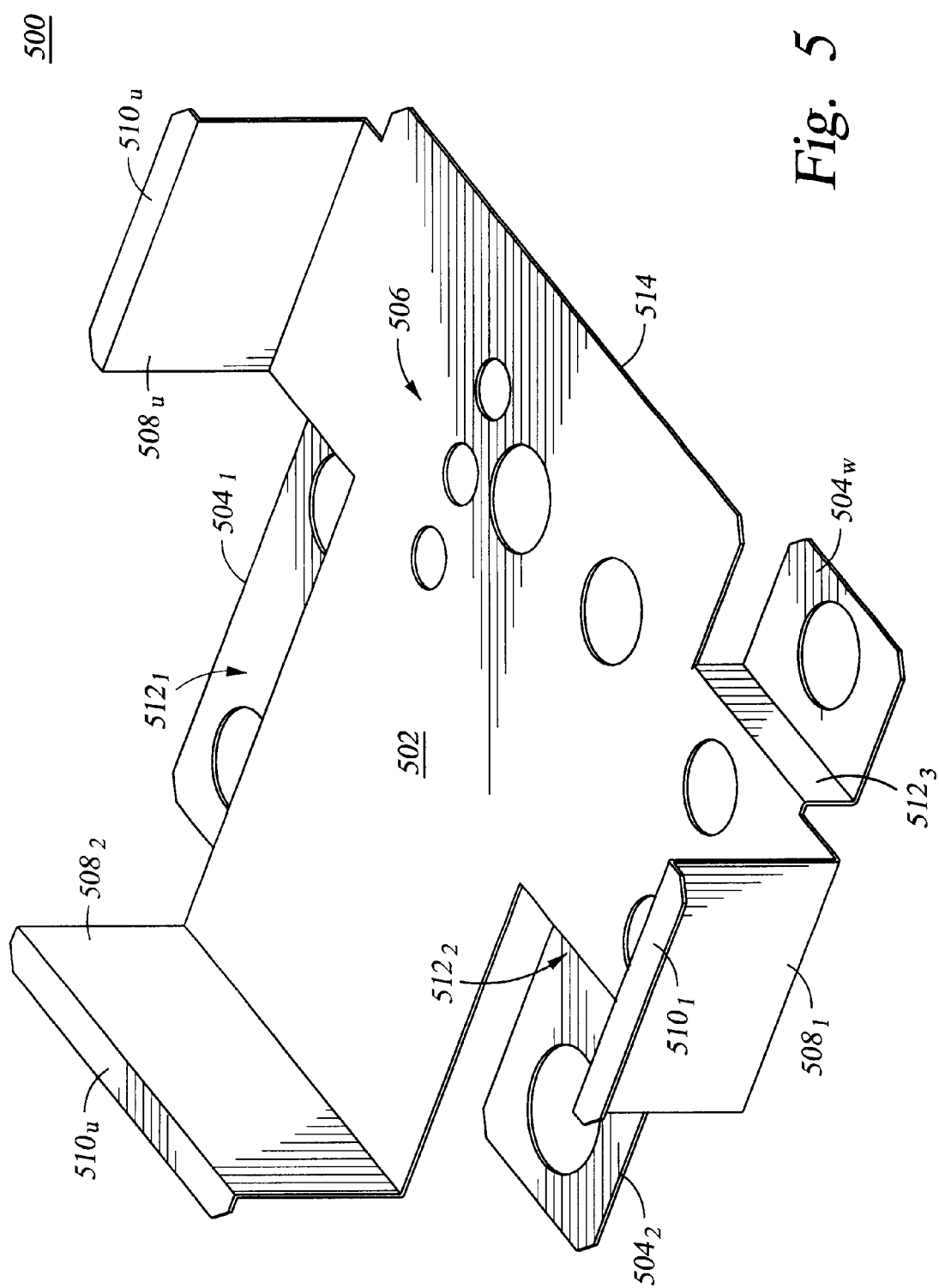
FIG. 5 depicts a perspective view of a gauge fixture of the present invention.

FIG. 5 depicts a perspective view of a gauge fixture 500 of the present invention. The gauge fixture 500 is a template that is disposed over the facilities integration plate 100 to gauge the heights of the facilities conduits 108 during installation. Specifically the gauge fixture 500 is utilized to define the height of each conduit 402 as measured from the top surface of the floor 201. The gauge fixture 500 comprises a base 502, a plurality of tabs $504_1$ through $504_W$ (collectively tabs 504) having a plurality of apertures 506, and a plurality of panels 5081 through $508_U$ (collectively panels 508) each having a flange $510_1$ through $510_U$ (collectively flanges 510). The tabs 504 are each respectively coupled to the base 502 by a wall $512_1$ through $512_W$ (collectively walls 512). For the sake of clarity in FIG. 5, only a third wall $512_2$ is observable from view. The walls 512 have a height that defines the position of each tab $504_1$, $504_2$, and $504_3$ from the base 502. In one embodiment, the walls 512 extend perpendicular from a lower surface 514 of the first base 502 and each wall 512 has a height of approximately 1". The tabs 504 extend outward from the walls 512, such that the tabs 504 extend parallel and approximately 1" below the base 502.

The positioning of the tabs 504 is defined by the location of the facilities conduits 402. For example, the exhaust conduits $402_5$ and $402_2$, and power conduit $402_4$ are illustratively configured to be 1" lower in height than the remaining conduits such as the fluid supply conduits $402_1$. Therefore, the position of the apertures 108 along the X-Y coordinates of the facilities integration plate 100 define the location of the tabs 504. As such, the plurality of apertures 506 formed in the base 502 and tabs 504 are axially aligned with the apertures 108 in the facilities integration plate 100.

Figure 6:
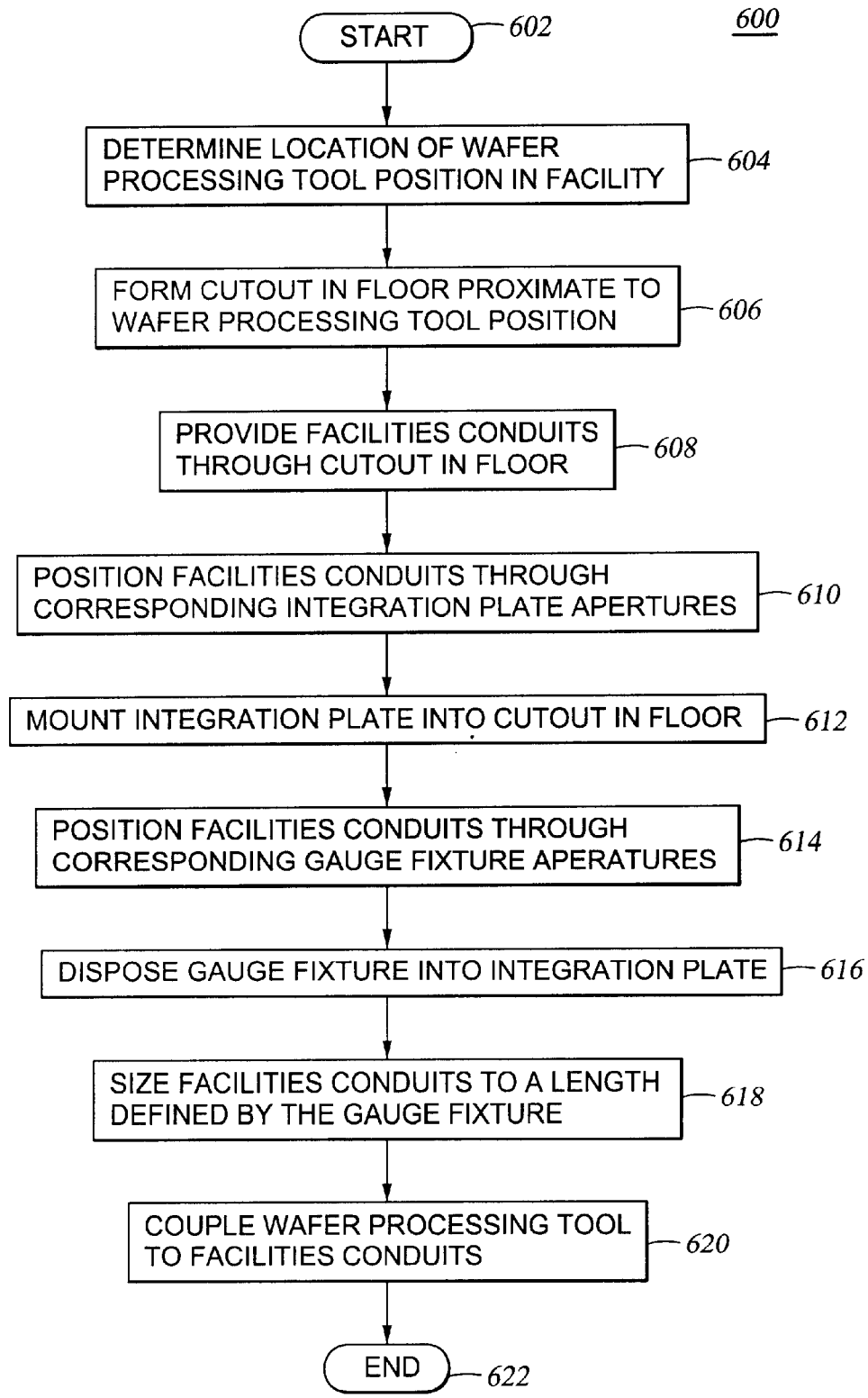
FIG. 6 depicts a flow chart of a method of installing the semiconductor wafer-processing tool to the plurality of facilities conduits utilizing the facilities integration plate of FIG. 1.

FIG. 6 depicts a flow chart of a method 600 of installing the semiconductor wafer-processing tool 202 to the plurality of facilities conduits 402 utilizing the facilities integration plate 100 of FIG. 1. The method 600 begins at step 602 and proceeds to step 604, where a determination of an approximate location of the wafer-processing tool 202 on the floor 201 in the wafer-processing facility 200 is made. In particular, floor measurements are taken of the wafer-processing facility 200 using X-Y coordinates, which include distances from walls, structures, and the like. In addition, measurements of the tool 202 are taken, or templates, such as Mylar templates of the tool footprint are provided to determine the positioning of the wafer-processing tool 202 in a room at the facility 200. One skilled in the art will recognize that any viable method of determining the positioning of the wafer-processing tool in the room at the facility may be utilized.

In step 606, a cutout 204 in the floor 201 is formed proximate the wafer-processing tool 202. Specifically, the floor 201 is raised such that there is access beneath the floor 201 to provide external power, gases, exhaust, and the like to the tool 202. In step 608, a plurality of facilities conduits 402 for facilitating external power, gases, exhaust, and the like, are positioned beneath the floor 201 and extend through the cutout 204 in the floor 201. In particular, the facilities conduits 402 run parallel under the floor 201 to the cutout 204, and then extend upward and perpendicular through the cutout 204.

The method 600 then proceeds to step 610, where the plurality of facilities conduits 402 are each positioned through corresponding sized apertures 108 in the facilities integration plate 100. Each facility conduit 402 has a corresponding aperture 108 in the facilities integration plate 100, which defines the position of each conduit 402 relative to the inner perimeter of the cutout 204.

The facilities integration plate 100 is moved downward, and in step 612, the facilities integration plate 100 is mounted into the cutout 204 in the floor 201. Specifically, the flange 106 mounts flush to the floor 201 such that the bottom plate 102 is parallel and below the top surface of the floor 201. In one embodiment, the outer perimeter of the sidewalls 104 of the facilities integration plate 100 corresponds to the inner perimeter of the cutout 204 in the floor 201. As such, the facilities integration plate 100 fits snugly in the cutout 204. In another embodiment, a gap exists between the outer perimeter of the adapter plate sidewalls 104 and the inner perimeter of the cutout 204. As such, a plurality of fasteners (e.g., set-screws or the like), extending through a plurality of sidewall bores 112 perpendicular to the perimeter of the cutout 204, are utilized to secure the facilities integration plate 100 within the perimeter of the cutout 204. In addition, the plurality of facilities conduits 402 are secured beneath the floor (e.g., clamps, fasteners, and the like) in their respective positions as defined by the apertures 108 in the facilities integration plate 100.

The method 600 then proceeds to step 614. In step 614, the gauge fixture 500 is aligned over the facilities conduits 402 such that each facilities conduit passes through a corresponding aperture 506 in the gauge fixture 500. As discussed with regard to FIG. 5, each aperture 506 in the gauge fixture 500 is coaxially aligned with the apertures 108 in the facilities integration plate 100. In step 616, the gauge fixture 500 is lowered down to the facilities integration plate 100 such that the flanges 510 on the panels 508 are seated on the flanges 106 of the facilities integration plate 100. Accordingly, the panels 508 are sized to fit within the bottom plate perimeter 109 and the sidewalls 104 of the facilities integration plate 100, and is removable with minimal effort on part of a facilities operator.

Once the gauge fixture 500 is inserted into the facilities integration plate 100, the method 600 proceeds to step 618. In step 618, each facilities conduit 402 is sized to a length defined by the gauge fixture 500. Specifically, the conduits 402 are cut at a height corresponding to the depth of the tabs 504 and base 502 of the gauge fixture 500. In particular, the conduits are marked at the horizontal plane of the base 502 and tabs 504. The gauge fixture 500 is removed from the facilities integration plate 100, and the conduits are then cut at each of their respective markings. In this manner, each conduit 402 extends through the cutout 204 at a height below the surface of the floor 201.

In step 620, the facilities conduits 402 are each coupled to the wafer-processing tool 202. Specifically, the conduits 402 are provided with fittings that couple with the interface kit 206. The interface kit 206 comprises a plurality of intermediate length conduits that interface with the wafer-processing tool 202, or conduits extending from the wafer-processing tool 202. Once the facilities conduits 402, interface kit 206, and the wafer-processing tool 202 are all connected, the entire lengths of conduits are checked for leaks and proper electrical connections. Upon positive results, the facilities conduits 402 are also coupled to their respective sources and supplies external to the wafer-processing tool 202 for subsequent use, and in step 622, the method 600 ends.

The facilities integration plate 100 and companion gauge fixture 500 assists a wafer manufacturer with preinstallation of the necessary facilities conduits 402 at a fabrication facility 200, prior to delivery of the wafer-processing tool 202. In this manner, the conduits 402 are secured beneath the floor 201 at a predetermined height such that a standard sized interface kit 206 may be utilized to couple the facilities conduits 402 to the processing tool during installation. As such the time required for installation of the tool is significantly reduced. Furthermore, since the facilities conduits 402 are precut within the facilities integration plate 100 to a height that is lower than the surface of the floor 201, a cover may be placed over the adapter plate to cover the exposed cutout and facilities integration plate 100. Therefore, the conduits will not be damaged during delivery of the wafer-processing tool 202. Moreover, the likelihood of injury is reduced, since the conduits 402 and facilities integration plate 100 are disposed below the cover.

Although the teachings of the present invention have been shown and described in detail herein, those skilled in the art can readily devise other varied embodiments that still incorporate the teachings and do not depart from the spirit of the invention.

What is claimed is:

1. A method of installing a plurality of facilities conduits in a wafer fabrication facility for subsequent coupling to a wafer-processing tool, said method comprising the steps of:
   determining a location where said wafer-processing tool is positioned in said wafer fabrication facility;
   forming a cutout in a floor of said fabrication facility corresponding to said location;
   providing said plurality of facilities conduits through said cutout in said floor;
   mounting a facilities integration plate within said cutout in said floor;
   disposing a gauge fixture within said facilities integration plate;
   sizing said facilities conduits to a length defined by said gauge fixture; and
   coupling said wafer-processing tool to said facilities conduits.

2. The method of claim 1 wherein said determining step further comprises the steps of:
   measuring said fabrication facility utilizing X-Y coordinates; and
   measuring a footprint of said wafer-processing tool.

3. The method of claim 2 wherein said footprint is provided by a template.

4. The method of claim 1 wherein said floor is a raised floor.

5. The method of claim 1, wherein said providing step further comprises the step of routing said plurality of facilities conduits beneath a raised floor of said fabrication facility.

6. The method of claim 5 wherein said plurality of conduits extends through said cutout and perpendicular to said raised floor.

7. The method of claim 1 wherein said mounting step further comprises the step of:

positioning said plurality of facilities conduits through a plurality of corresponding adapter apertures formed in said facilities integration plate; and sliding said facilities integration plate into the cutout of said floor.

8. The method of claim 7 wherein a flange of said facilities integration plate is mounted flush to a top surface of said floor.

9. The method of claim 8 wherein a bottom plate of said facilities integration plate is positioned parallel to said cutout and below said top surface of said floor.

10. The method of claim 9, wherein said disposing step further comprises the steps of:

positioning said plurality of facilities conduits through a plurality of corresponding fixture apertures formed in said gauge fixture; and sliding said gauge fixture into the facilities integration plate.

11. The method of claim 10 wherein a flange of said gauge fixture is disposed over and flush with a top surface of said facilities integration plate flange.

12. The method of claim 11 wherein a base and a plurality of plates of said gauge fixture are positioned parallel to and above a bottom plate of said facilities integration plate, and said plurality of fixture apertures of said gauge fixture are coaxially aligned with said plurality of adapter apertures of said facilities integration plate.

13. The method of claim 12 wherein said sizing step further comprises the steps of:

marking each of said plurality of facilities conduits in a horizontal plane defined by a base and plurality of plates of said gauge fixture;

removing said gauge fixture; and cutting each of said plurality of facilities conduits at each mark.

14. The method of claim 1 wherein said coupling step further comprises the steps of:

coupling a plurality of interface conduits between said plurality of facilities conduits and said wafer-processing tool.

15. The method of claim 1 further comprising the step of covering said facilities integration plate and said facilities conduits prior to coupling step.

* * * * *